(12) United States Patent
Ichitsubo et al.

(10) Patent No.: US 7,253,681 B2
(45) Date of Patent: Aug. 7, 2007

(54) POWER AMPLIFIER WITH INTEGRATED SENSORS

(75) Inventors: Ikuroh Ichitsubo, Kanagawa Prefecture (JP); Weiping Wang, Palo Alto, CA (US)

(73) Assignee: Micro-Mobio, Palo Alto, CA (US)

( * ) Notice: Subject to any disclaimer, the term of this patent is extended or adjusted under 35 U.S.C. 154(b) by 0 days.

(21) Appl. No.: 11/433,896

(22) Filed: May 12, 2006

(65) Prior Publication Data

US 2006/0202757 A1 Sep. 14, 2006

Related U.S. Application Data

(63) Continuation-in-part of application No. 10/938,779, filed on Sep. 10, 2004, now Pat. No. 7,071,783, which is a continuation-in-part of application No. 10/385,059, filed on Mar. 9, 2003, now Pat. No. 6,822,515.

(60) Provisional application No. 60/397,261, filed on Jul. 19, 2002.

(51) Int. Cl.
  *H03G 3/20* (2006.01)
(52) U.S. Cl. ....................... 330/140; 330/129
(58) Field of Classification Search .................. 330/85, 330/129, 140, 279, 285, 288, 289
  See application file for complete search history.

(56) References Cited

U.S. PATENT DOCUMENTS

| | | | |
|---|---|---|---|
| 4,977,041 A | 12/1990 | Shiozawa et al. | |
| 5,050,238 A | 9/1991 | Tomizuka et al. | |
| 5,164,683 A | 11/1992 | Shields | |
| 5,255,324 A | 10/1993 | Brewer et al. | |
| 5,548,239 A | 8/1996 | Kohama | |
| 5,625,894 A | 4/1997 | Jon | |
| 5,656,972 A | 8/1997 | Norimatsu | |
| 5,732,334 A | 3/1998 | Miyoke | |
| 5,825,227 A | 10/1998 | Kohama et al. | |
| 5,880,635 A | 3/1999 | Satoh | |
| 5,901,346 A * | 5/1999 | Stengel et al. | ............... 330/129 |
| 5,969,560 A | 10/1999 | Kohama et al. | |
| 6,025,651 A | 2/2000 | Nam | |
| 6,047,168 A * | 4/2000 | Carlsson et al. | ............ 330/285 |
| 6,075,995 A | 6/2000 | Jensen | |
| 6,118,985 A | 9/2000 | Kabuakyu et al. | |
| 6,148,220 A | 11/2000 | Sharp et al. | |
| 6,151,509 A | 11/2000 | Chorey | |
| 6,175,279 B1 | 1/2001 | Ciccarelli et al. | |
| 6,183,703 B1 | 2/2001 | Hsu et al. | |
| 6,198,351 B1 | 3/2001 | Winslow | |

(Continued)

OTHER PUBLICATIONS

U.S. Appl. No. 10/385,059, filed Mar. 2003, Ichitsubo et al.

(Continued)

*Primary Examiner*—Khanh Van Nguyen
(74) *Attorney, Agent, or Firm*—Tran & Associates

(57) ABSTRACT

An amplifier circuit for amplifying radio frequency signals includes a radio frequency power amplifier to receive an input radio frequency signal and to output an amplified radio frequency signal; one or more sensors coupled to the radio frequency power amplifier to provide a closed-loop feedback signal; and a power sensor coupled to the amplified radio frequency signal.

17 Claims, 5 Drawing Sheets

U.S. PATENT DOCUMENTS

| | | |
|---|---|---|
| 6,203,587 B1 | 3/2001 | Lesieur et al. |
| 6,262,630 B1 | 7/2001 | Eriksson |
| 6,265,943 B1 | 7/2001 | Dening |
| 6,281,755 B1 | 8/2001 | Feld et al. |
| 6,281,762 B1 | 8/2001 | Nakao et al. |
| 6,366,788 B1 | 4/2002 | Fujioka et al. |
| 6,417,730 B1 | 7/2002 | Segallis et al. |
| 6,462,622 B1 | 10/2002 | Mori et al. |
| 6,483,398 B2 | 11/2002 | Nagamori et al. |
| 6,496,684 B2 | 12/2002 | Nakao et al. |
| 6,625,050 B2 | 9/2003 | Suwa et al. |
| 6,630,372 B2 | 10/2003 | Ball |
| 6,639,466 B2 | 10/2003 | Johnson |
| 6,678,506 B1 | 1/2004 | Dolman et al. |
| 6,693,498 B1 | 2/2004 | Sasabata et al. |
| 6,694,129 B2 | 2/2004 | Peterzell et al. |
| 6,720,850 B2 | 4/2004 | Sasabata et al. |
| 6,774,718 B2 | 8/2004 | Ichitsubo et al. |
| 6,798,287 B2 | 9/2004 | Wu et al. |
| 6,822,515 B2 | 11/2004 | Ichitsubo et al. |
| 6,847,262 B2 | 1/2005 | Ichitsubo et al. |
| 6,914,482 B2 | 7/2005 | Ichitsubo et al. |
| 7,071,783 B2 | 7/2006 | Ichitsubo et al. |
| 2004/0203552 A1 | 10/2004 | Horiuchi et al. |
| 2004/0204037 A1 | 10/2004 | He et al. |
| 2005/0179498 A1 | 8/2005 | Tsutsui et al. |
| 2005/0239415 A1 | 10/2005 | Sagae et al. |

OTHER PUBLICATIONS

U.S. Appl. No. 10/843,409, filed May 2004, Ichitsubo et al.
U.S. Appl. No. 10/919,850, filed Aug. 2004, Ichitsubo et al.
U.S. Appl. No. 10/938,779, filed Sep. 2004, Ichitsubo et al.
U.S. Appl. No. 10/972,636, filed Oct. 2004, Ichitsubo et al.
U.S. Appl. No. 10/039,687, filed Jan. 2005, Ichitsubo et al.
U.S. Appl. No. 10/064,261, filed Feb. 2005, Ichitsubo et al.
U.S. Appl. No. 11/110,249, filed Apr. 2005, Ichitsubo et al.
U.S. Appl. No. 11/121,288, filed May 2005, Ichitsubo et al.
U.S. Appl. No. 11/126,667, filed May 2005, Ichitsubo et al.
U.S. Appl. No. 11/152,308, filed Jun. 2005, Ichitsubo et al.
U.S. Appl. No. 11/173,741, filed Jul. 2005, Ichitsubo et al.
U.S. Appl. No. 11/173,965, filed Jul. 2005, Ichitsubo et al.
U.S. Appl. No. 11/173,968, filed Jul. 2005, Ichitsubo et al.
U.S. Appl. No. 11/323,763, filed Dec. 2005, Ichitsubo et al.
U.S. Appl. No. 11/323,788, filed Dec. 2005, Ichitsubo et al.
U.S. Appl. No. 11/488,465, filed Jul. 2006, Chang et al.
U.S. Appl. No. 60/696,206, filed Jul. 2, 2005, Kubota.
U.S. Appl. No. 60/698,586, filed Jul. 2, 2005, Ikuroh.

\* cited by examiner

Figure 1: Prior Art

POWER AMPLIFIER WITH INTEGRATED SENSORS

This application is a continuation-in-part (CIP) of application Ser. No. 10/938,779 filed Sep. 10, 2004 now U.S. Pat. No. 7,071,783, which in turn is a CIP of application Ser. No. 10/385,059 filed Mar. 9, 2003 now U.S. Pat. No. 6,822,515, which in turn claims priority to Provisional Application Ser. No. 60/397,261, filed on Jul. 19, 2002, entitled "Power Amplifier Modules for Wireless LAN Applications," the contents of which are hereby incorporated by reference. The present invention is also related to the commonly assigned U.S. patent application Ser. No. 10/041,863, filed on Oct. 22, 2001, titled "Multilayer RF Amplifier Module", by Wang, et al., and the commonly assigned and concurrently filed U.S. patent application "Power Amplifier Module for wireless communication devices" by Ichitsubo et al. The disclosures of these related applications are incorporated herein by reference.

TECHNICAL FIELD

The present invention relates generally to radio frequency (RF) power amplifiers, more specifically, to power sensing for RF power amplifiers.

BACKGROUND

Radio frequency transmission of an electrical signal occurs in a broad frequency spectrum from several megahertz (MHz) to tens of gigahertz (GHz). Common RF transmission systems include an antenna that transmits and receives RF signals and a low noise amplifier that amplifies an input RF signal from the antenna and a power amplifier to generate an amplified signal to be delivered to the antenna. The power of the output signals from the power amplifiers are required to be controlled within stringent specifications as well as regulatory standards, to assure the quality of the RF transmission signals. Moreover, many portable wireless systems are required to increase or reduce the transmitted power depending upon signal strength, transmission range, the types of digital signal modulation such as Quadrature Phase Shift Keying (QPSK) and Orthogonal Frequency Division Multiplexing (OFDM), as well as surrounding interfering signals. These requirements can be met by a power sensing circuit that samples the output power of the power amplifier and outputs a power sensing signal for power control. However, variations in power sensing signals due to temperature and DC bias are also passed on to the power output through the control loop. Variations in power sensing signals can significantly affect the qualities of the output RF signals. A need therefore exists for accurate and reliable techniques for power sensing for RF power amplifiers with good temperature and DC bias compensations.

SUMMARY

In one aspect, an amplifier circuit for amplifying radio frequency signals includes a radio frequency power amplifier to receive an input radio frequency signal and to output an amplified radio frequency signal; one or more sensors coupled to the radio frequency power amplifier to provide a closed-loop feedback signal; and a power sensor coupled to the amplified radio frequency signal.

In another aspect, a circuit for sensing radio frequency signals from a power amplifier includes a phase sensor coupled to the power amplifier to provide a closed-loop phase feedback signal; a gain sensor coupled to the power amplifier to provide a closed-loop gain feedback signal and a power sensor coupled to the power amplifier to provide a closed-loop power feedback signal, the power sensor providing a power-sensing signal.

In yet another aspect, a circuit for sensing radio frequency (RF) signals from a power amplifier includes one or more sensors coupled to the power amplifier to provide a closed-loop feedback signal; and a power sensor coupled to the power amplifier to provide a closed-loop power feedback signal, the power sensor providing a power-sensing signal.

In yet another aspect, the system includes an amplifier circuit for amplifying radio frequency signals having temperature compensation and bias compensation, including: a) a radio frequency power amplifier to receive an input radio frequency signal and to output an amplified radio frequency signal; b) a detector, including a first base to receive the amplified radio frequency signal, a second DC bias input signal from a regulated DC source, and a third power-sensing signal; and a first collector connected to the first base; and an amplifier for the DC component of the RF signal from the first base, including: a second base coupled to the first base; and a second collector to output the power-sensing signal.

In another aspect, the system provides a power sensing circuit for detecting power of a power amplifier. The power sensing circuit includes a detector diode using a transistor and a DC amplifier using a second transistor. The second transistor acts as a current mirror circuit regarding the DC current component of the first transistor and compensates variations in the power sensing circuit. The power sensing signal is provided in a single output terminal.

In another aspect, the present invention provides a circuit design that is simple and easy to implement using Heterojunction Bipolar Transistors (HBT) materials such as InGaP/GaAs which improves reliability relative to prior art.

Advantages of the sensors may include one or more of the following. The processing circuit can receive feedback from the power amplifier output to adjust for variations in temperature, environment, age, or any other factors that may affect power amplifier performance.

Another advantage is that the temperature variation of the power sensing circuit is properly compensated to provide accurate power sensing at a wide temperature range.

Another advantage is that the invention power sensing circuit directly senses the final output RF signal and can thus inclusively detect variations in the whole power amplifying circuit.

Yet another advantage is that the invention power sensing circuit is simpler and easier to implement compared to prior art systems.

The details of one or more embodiments are set forth in the accompanying drawing and in the description below. Other features, objects, and advantages of the invention will become apparent from the description and drawings, and from the claims.

BRIEF DESCRIPTION OF THE DRAWINGS

The accompanying drawing, which are incorporated in and form a part of this specification, illustrate embodiments of the invention and, together with the description, serve to explain the principles of the invention.

DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
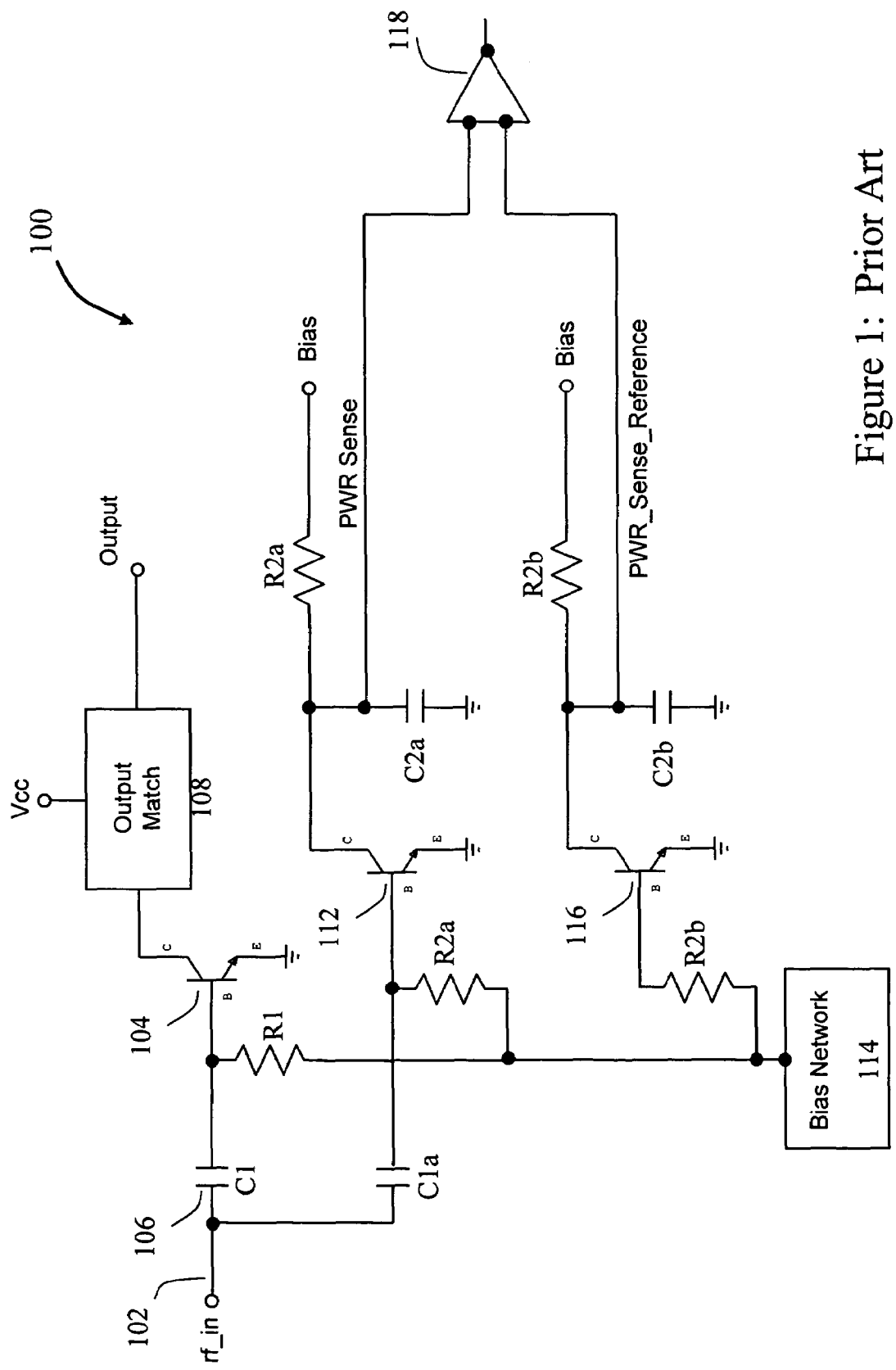
FIG. 1 is a simplified schematic diagram illustrating a RF power sensing circuit in the prior art.

FIG. 1 shows a simplified schematic diagram of a prior art system 100 disclosed in U.S. Pat. No. 6,265,943. A RF signal is received by the prior art system 100 at the RF-in signal port 102 where it is coupled to a RF amplifier transistor 104 via coupling capacitor 106. An output matching network 108 provides impedance matching to the antenna to provide efficient transmission of the amplified RF signal to the associated antenna. A small RF sampling transistor 112 is deployed in parallel with the RF amplifier transistor 104, which is physically much larger than the small sampling transistor 112. The small sampling transistor 112 is DC biased via a dedicated bias network 114. The size of the small sampling transistor 112 may, for example, be about $1/250_{th}$ the size of the RF amplifier transistor 104.

The prior art system 100 includes a second small sampling transistor 116 to compensate for a dominating quiescent bias current at low power levels. This second small sampling transistor 116 is also physically much smaller than the RF amplifier transistor 104 and is optionally the same physical size as the first small sampling transistor 112. The second small RF sampling transistor 116 is deployed in parallel with the first small sampling transistor 112, however, it does not receive any of the RF drive energy from the input stage. Rather, the second small sampling transistor 116 amplifies and receives only the bias current from the bias networking 114. The predicted power can be corrected for bias current effects and bias current shifts. A differential amplifier 118 is connected between the PWR_Sense and PWR_Sense_Reference in order to cancel erroneous contributions of the bias current to the predicted power.

Figure 2:
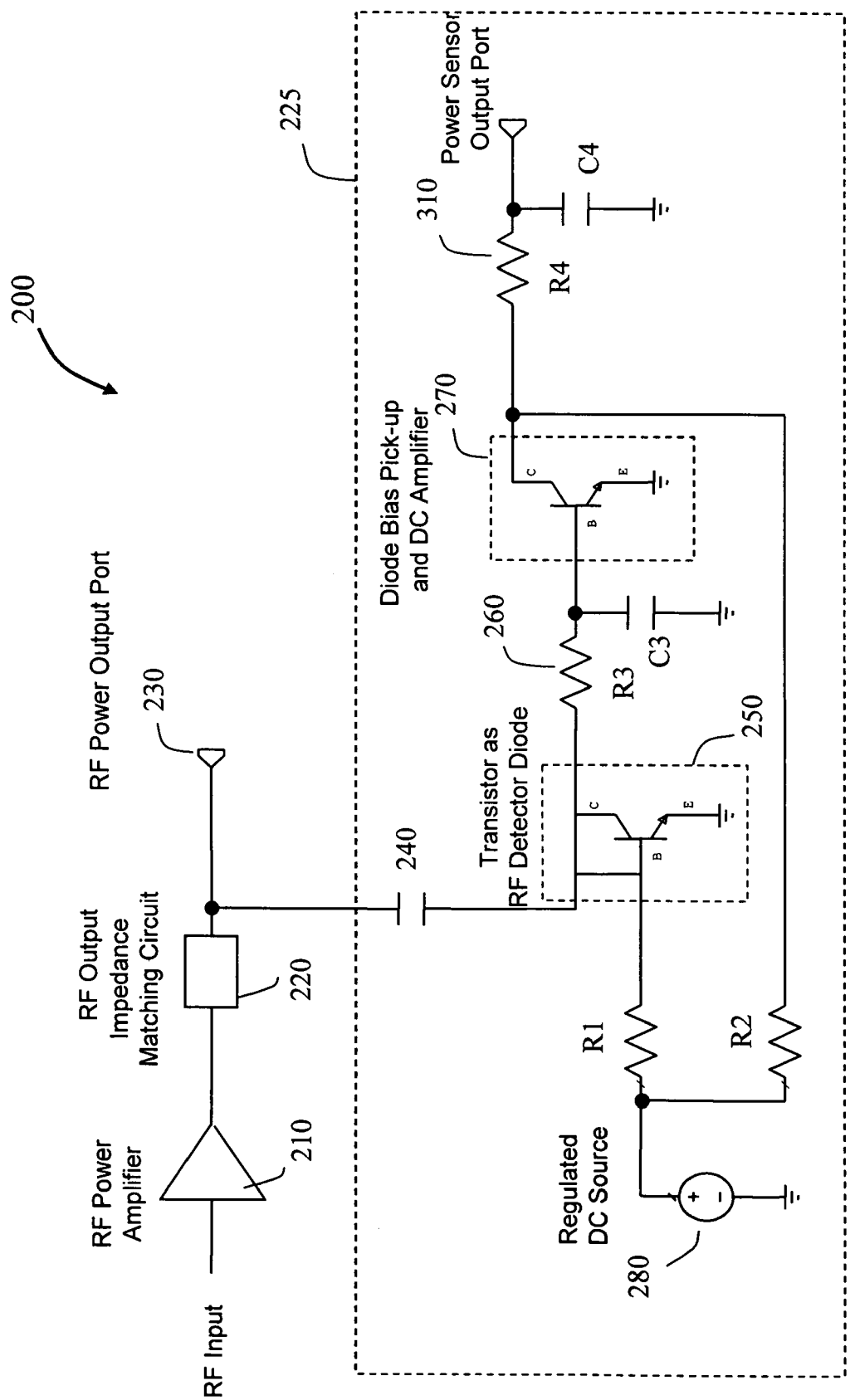
FIG. 2 is a schematic circuit diagram illustrating a first RF amplifier circuit having power sensing in accordance to the present invention.

Illustrated in FIG. 2 is a schematic circuit diagram of a RF amplifier circuit 200 in accordance to the present invention. The RF amplifier circuit 200 includes a RF power amplifier 210, a RF output impedance matching circuit 220 and RF power output port 230. The RF amplifier circuit 200 also includes a RF power sensing circuit 225 that senses the amplified RF signal output by the RF power amplifier 210 and through the RF output impedance matching circuit 220. The RF power sensing circuit 225 includes a first transistor 250 that detects RF signal from the output of RF power amplifier 210 through a coupling capacitor 240. The base and the collector of the first transistor 250 are electrically connected so that the first transistor 250 acts as a diode. The current flowing into the first transistor 250 (Detector) depends on the output RF voltage of the RF power amplifier 210. The RF power sensing circuit 225 also includes a second transistor 270 having its base connected to the base of the first transistor 250 through a low-pass filter 260 (R3, C3). The second transistor 270 thus functions as a DC amplifier of the DC bias diode (i.e. the first transistor 250).

The collector of the second transistor 270 is coupled to a regulated DC source 280 by resistor R2. The base and the collector of the first transistor 250 are coupled to a regulated DC source 280 by resistor R1. The regulated DC source 280 provides a temperature-compensated, constant voltage well known in the art.

In this circuit layout, the second transistor 270 acts as a current mirror circuit regarding the DC current component of the first transistor 250. That is:

$$I_2 = S \times I_1,$$

wherein S is the size ratio of the second transistor 270 to the first transistor 250, and $I_1$ and $I_2$ are the currents flowing through the bases of the first transistor 250 and the second transistor 270 respectively. S=1, if the sizes of the two transistors are the same.

The output RF voltage of the RF power amplifier 210 can be picked up at the collector voltage of the second transistor 270. The output signal of the RF power sensing circuit 225 is coupled to the collector of the second transistor 270 through a low-pass filter (R4, C4) that acts as a buffer to isolate the RF power sensing circuit 225 from external RF signals. The output signal of the RF power sensing circuit 225 is substantially proportional to the strength of the amplified radio frequency signal output by power amplifier 210.

The RF amplifier circuit 200 and the RF power sensing circuit 225 illustrated in FIG. 2 are simple and easy to implement in Heterojunction Bipolar Transistor (HBT) Integrated Circuits, for example, using Gallium Arsenide materials. The detector diode (i.e. the first transistor 250) and the DC amplifier (i.e. the second transistor 270) are proximity with each other. The first transistor 250 and the second transistor 270 therefore experience correlative temperature variations (thus similar variations in I-V response curves). For example, an upward temperature fluctuation causes the $I_1$ to rise and first base voltage to drop, which also causes second base voltage to drop and $I_2$ to drop. The counter balance between the two effects effectively compensates temperature variations.

Figure 3:
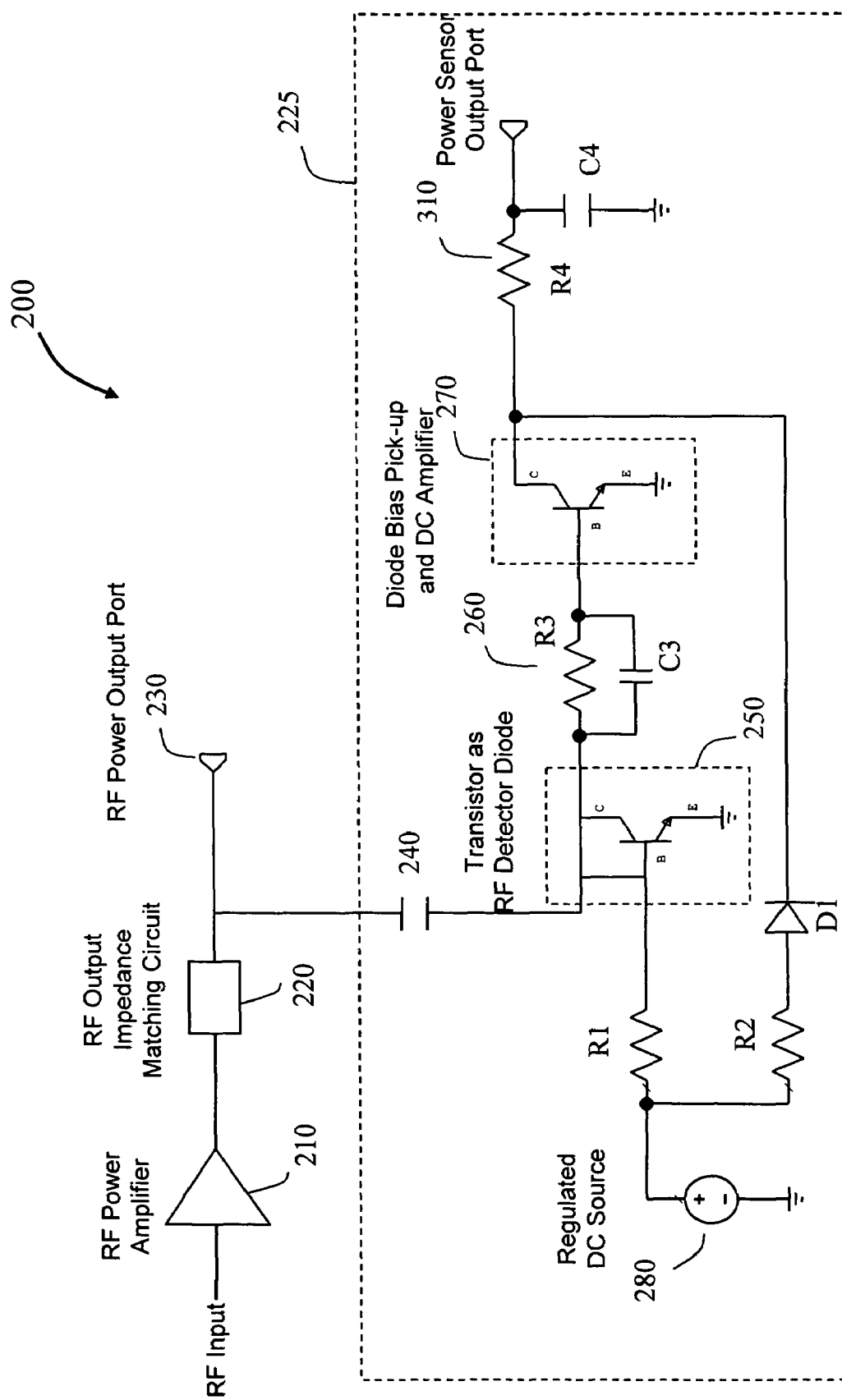
FIG. 3 is a schematic circuit diagram illustrating a second RF amplifier circuit having power sensing in accordance to the present invention.

FIG. 3 shows another embodiment of the circuit of FIG. 2. FIG. 3 is similar to FIG. 2, with the additional temperature compensation diode D1 coupled between the regulated DC source and the second collector and a capacitor C3 coupled between the first collector and the second base.

The power sensing circuit reads average power. When compared to the peak envelope of the RF signal, the PAR (peak to average ratio) can be used for optimizing efficiency and performance of the power amplifier. For example, when the PAR is high, the biasing current can be increased for higher output, and when PAR is low, the biasing current can be increased for better efficiency.

Several advantageous distinctions can be found in the RF amplifier circuit 200 and the RF power sensing circuit 225 in the present invention, in comparison to the prior art system 100. One important design difference is that the invention RF power sensing circuit 225 in FIG. 2 directly senses the output signal from the power amplifier 210 and the RF output impedance matching circuit 220 whereas the prior art system 100 senses the input signal to RF amplifier transistor 104. The variations that the invention RF power sensing circuit 225 senses includes variations arisen from the RF power amplifier 210 and the output impedance matching circuit 220. In contrast, the prior art system 100 does not detect and thus cannot compensate variations in the RF amplifier transistor 104 and/or the output matching network 108. Variations in the RF amplifier transistor and output matching circuit can be caused, for example, by temperature variations, batch-to-batch variability in component fabrication, and operation variability over a component's life cycle, among others.

Another advantage is that the design of a single output terminal in FIG. 2 is easier to use compared to the prior art system 100. The first and the second transistors 250, 270 are in close proximity to each other and thus experience correlative temperature variations. The temperature and bias variations within RF power sensing circuit 225 are inherently compensated in the current mirror circuit of the two transistors. In contrast, the prior art system 100 includes parallel transistors and multiple terminals. The prior art system 100 also relies on an additional differential amplifier to cancel erroneous contributions of the bias current.

Figure 4A:
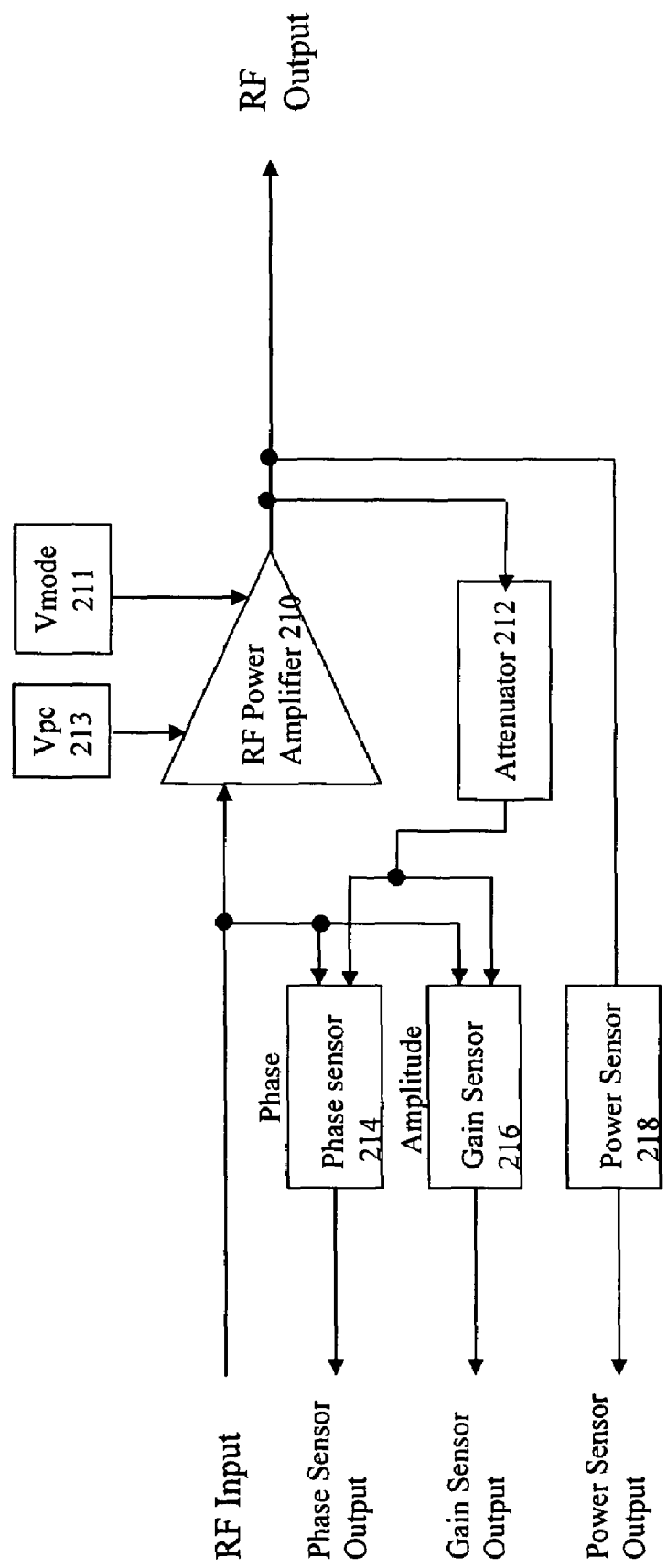
FIG. 4A shows a first power amplifier embodiment with a plurality of feedback sensors.

FIG. 4A is a block diagram of a power amplifier embodiment with a plurality of feedback sensors. In FIG. 4A, a power amplifier 210 receives RF input from an RF source such as a transceiver. The input can provide amplitude and phase feed-forward control. The output of the power amplifier 210 is presented to an antenna as a RF output signal. An attenuator 212 is connected to the output of the power amplifier 210 and in turn drives one or more sensors that provide phase and/or amplitude feedback information.

In one embodiment, the RF input from the power amplifier 210 and the output from the attenuator 212 are provided to a gain sensor 214, whose gain output is provided as a closed-loop feedback for amplitude control.

In another embodiment, the RF input from the power amplifier 210 and the output from the attenuator 212 are provided to a phase sensor 216, whose phase output is provided as a closed-loop feedback for phase control.

The output of the power amplifier 210 can be provided to a power sensor 218 to provide power sensor output.

The device can operate in an open loop mode, a closed loop mode, both modes, or may operate in a calibration mode. Alternatively, both gain sensor 216 and phase sensor 218 may be used. These sensors detect gain distortion, phase distortion or both distortions that may be caused by temperature, environmental factors, antenna load, or age. A signal processor (not shown) receives the outputs of the sensors and can adjust the output of the power amplifier 210 to compensate for distortions or variations caused by temperature, environmental factors, antenna load, or age, among others. The resulting output of the power amplifier 210 can be maintained to be as linear as possible to provide a high quality output.

In accordance with the present invention, the PA is turned ON and OFF by a Vpc 213 control signal, while the biasing currents and the biasing voltages of the power amplifier can be digitally controlled by a mode control signal called Vmode 211. The Vmode control signal can be in serial or parallel. The external input signals can be provided by a base band processor.

The Vmode control can operated depending on the power level and the linearity of the output power. The Vmode control over power supply voltage can affect the collector voltage which in turn can affect the biasing currents, phase and gain of the power transistors. For example, when the power amplifier is transmitting high power, the mode control circuit can set the power transistors to operate at high current state to minimize output distortion. When the device needs to transmit low power, the mode control circuit sets the power amplifier with low current to conserve battery life. The Vmode control can accept 1 bit, 2 bits or more bits of data to control the bias voltages or biasing current of the power transistors in two or more levels.

The flexibility of dynamically and digitally setting biasing states for the power transistors with Vmode can be used by baseband in conjunction with the feedback signals from phase sensor, gain sensor and power sensor to optimize power and performance for different applications.

Typically, the input to the power amplifier is connected to a RF transceiver which up-convert a lower frequency basedband signal into high frequency radio signal. The distortion of the power amplifier output may be caused by temperature, environment, load, component age, or output power level, among others. The distortion of the power amplifier output can be detected with the phase sensor and the gain sensor. As a result, the baseband processor or the transceiver can compensate for such distortion on the input signal of the power amplifier based on the feedback signal of the gain sensor and phase sensor.

Figure 4B:
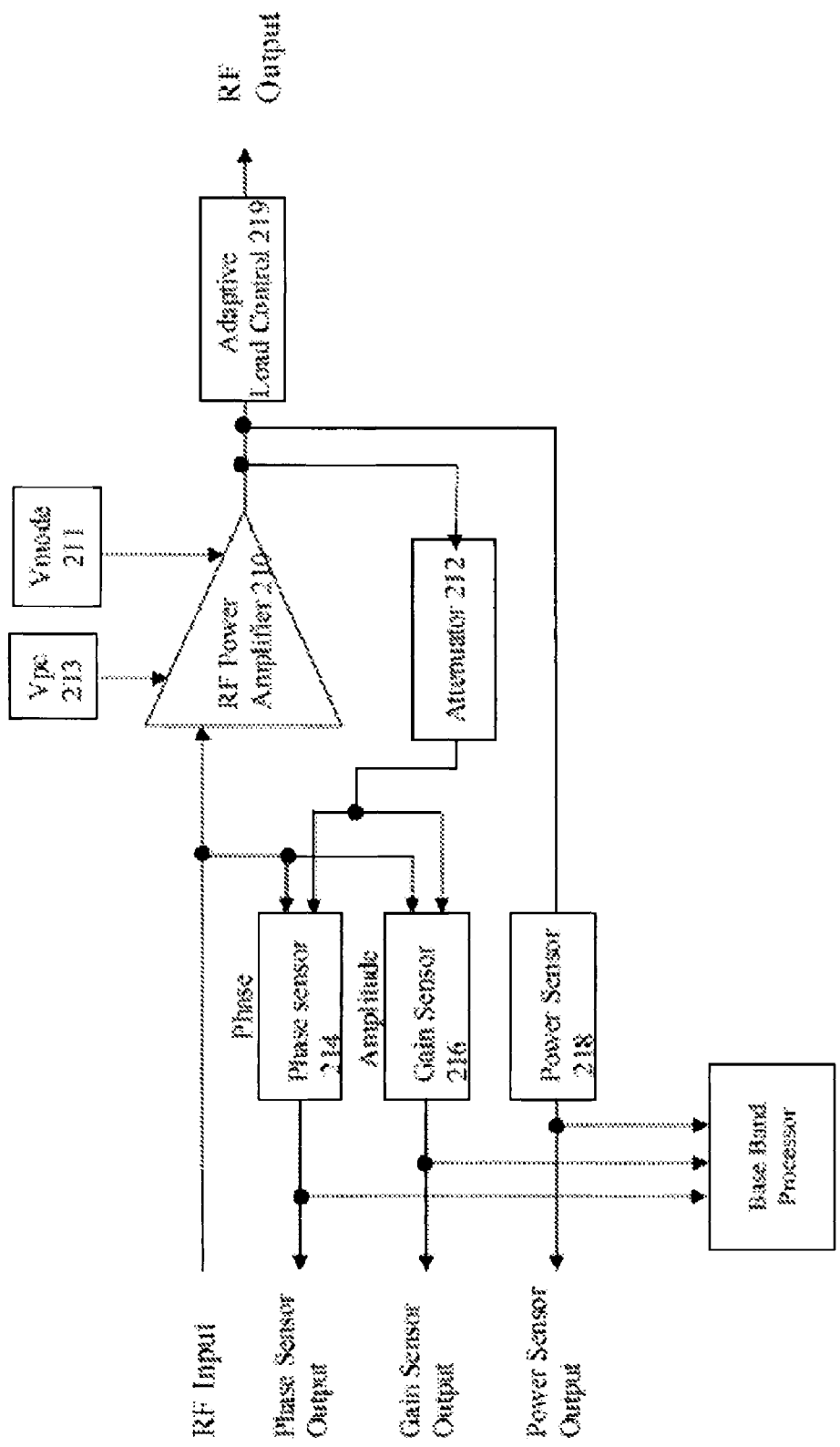
FIG. 4B shows a second power amplifier embodiment with a plurality of feedback sensors and adaptive load control.

Turning now to FIG. 4B, a second power amplifier embodiment with a plurality of feedback sensors and adaptive load control is shown. This embodiment is similar to the embodiment of FIG. 4A, with the addition of an adaptive load control unit 219 positioned at the output port of the power amplifier to match the power amplifier to the load such as a filter or an antenna. The adaptive load control unit 219 includes one or more switching devices to change the output impedance matching network of the power amplifier to that of the filter or antenna to maintain/improve efficiency and linearity, depending on the operating condition of the PA and the load condition, among others. The switching devices can be pHEMT switch, CMOS switch, MEMS switch, PIN diode and so forth. With the switching devices, the output impedance of the power amplifier can be changed to optimally match the load impedance presented to the PA by the post-PA filter and the antenna.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. An amplifier circuit for amplifying radio frequency signals, comprising:
   a radio frequency power amplifier to receive an input radio frequency signal and to output an amplified radio frequency signal;
   one or more sensors coupled to the radio frequency power amplifier to provide a closed-loop feedback signal; and a power sensor coupled to the amplified radio frequency signal, wherein the sensors comprise a gain sensor and a phase sensor coupled to the radio frequency power amplifier.

2. The amplifier circuit of claim 1, wherein the gain sensor is coupled to the radio frequency power amplifier to measure output amplitude.

3. The amplifier circuit of claim 1, wherein the phase sensor is coupled to the radio frequency power amplifier to measure output phase.

4. The amplifier circuit of claim 1, wherein the power sensor generates a power-sensing signal substantially proportional to the strength of the amplified radio frequency signal.

5. The amplifier circuit of claim 4 wherein the power-sensing signal is provided to an external circuit through a low-pass filter.

6. The amplifier circuit of claim 1, comprising a mode signal to control a power level and a linearity of the radio frequency power amplifier output power.

7. The amplifier circuit of claim 1, comprising an adaptive load control unit coupled to the radio frequency power amplifier.

8. The amplifier circuit of claim 7, comprising one or more switching devices to change a matching network of the radio frequency power amplifier.

9. The amplifier circuit of claim 1, comprising:
an impedance-matching circuit coupled to the output of the radio frequency power amplifier; and
an attenuator coupled to the impedance-matching circuit.

10. A circuit for sensing radio frequency signals, comprising:
a radio frequency power amplifier to receive an input radio frequency signal and to output an amplified radio frequency signal;
a phase sensor coupled to the radio frequency power amplifier to provide a closed-loop phase feedback signal;
a gain sensor coupled to the radio frequency power amplifier to provide a closed-loop gain feedback signal; and
a power sensor coupled to the radio frequency power amplifier to provide a closed-loop power feedback signal, the power sensor providing a power-sensing signal, wherein the power sensor generates a power-sensing signal substantially proportional to the strength of the amplified radio frequency signal and wherein the power-sensing signal is provided to an external circuit through a low-pass filter.

11. The circuit of claim 10 wherein the power-sensing signal is substantially proportional to the strength of the input radio frequency signal.

12. The circuit of claim 10 wherein the power-sensing signal is provided to an external circuit through a low-pass filter.

13. The circuit of claim 10, comprising a power control signal to turn on or off the radio frequency power amplifier.

14. The circuit of claim 10, comprising a mode signal to control a power level and a linearity of the radio frequency power amplifier output power.

15. The circuit of claim 14 wherein the mode signal comprises one of: a parallel signal, a serial signal.

16. A circuit for sensing radio frequency (RF) signals, comprising:
a radio frequency power amplifier to receive an input radio frequency signal and to output an amplified radio frequency signal;
one or more sensors coupled to the power amplifier to provide a closed-loop feedback signal; and
a power sensor coupled to the power amplifier to provide a closed-loop power feedback signal, the power sensor providing a power-sensing signal, wherein the sensors comprise a gain sensor and a phase sensor coupled to the radio frequency power amplifier.

17. The circuit of claim 16, comprising a processor coupled to at least one of the sensors to compensate for distortion caused by one of: temperature, environment, load, component age, output power level.

* * * * *